(12) United States Patent
Apetz

(10) Patent No.: US 7,799,136 B2
(45) Date of Patent: Sep. 21, 2010

(54) METHOD OF CLEANING AT LEAST ONE SURFACE OF AN OPTICAL DEVICE DISPOSED IN A VACUUM CHAMBER

(75) Inventor: Rolf Theo Anton Apetz, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/566,963

(22) PCT Filed: Jul. 19, 2004

(86) PCT No.: PCT/IB2004/051250

§ 371 (c)(1),
(2), (4) Date: Jan. 26, 2006

(87) PCT Pub. No.: WO2005/010617

PCT Pub. Date: Feb. 3, 2005

(65) Prior Publication Data

US 2006/0272672 A1     Dec. 7, 2006

(30) Foreign Application Priority Data

Jul. 29, 2003    (EP) ................................ 03102333

(51) Int. Cl.
*B08B 7/00*      (2006.01)

(52) U.S. Cl. ............................ 134/1; 134/19; 134/21
(58) Field of Classification Search ................ 134/1, 134/19, 21, 18, 104.2, 105, 201, 902
See application file for complete search history.

(56) References Cited

U.S. PATENT DOCUMENTS

| 6,444,037 B1 * | 9/2002 | Frankel et al. ............... 118/715 |
| 2002/0097285 A1 | 7/2002 | Ishizaki |
| 2004/0160155 A1 * | 8/2004 | Partlo et al. ............. 313/231.31 |

FOREIGN PATENT DOCUMENTS

| EP | 1220038 A1 | 7/2002 |
| WO | 9902969 A1 | 1/1999 |
| WO | 9957607 A1 | 11/1999 |
| WO | WO 01/37309 | * 5/2001 |
| WO | 02054115 A2 | 7/2002 |

* cited by examiner

*Primary Examiner*—Michael Kornakov
*Assistant Examiner*—Eric Golightly

(57) ABSTRACT

A method of cleaning at least one surface of an optical device disposed in a vacuum chamber, which is at least partially contaminated by atoms and/or ions of metalloid and/or metal introduced by a radiation source generating, such as extreme ultraviolet radiation and/or soft X-rays is described. In order to achieve a longer service life for the optical device, the method is designed such that a temperature prevailing on the surface and/or a pressure in the vacuum chamber is adjusted in such a way that the atoms and/or ions hitting the surface are removed.

14 Claims, 2 Drawing Sheets

METHOD OF CLEANING AT LEAST ONE SURFACE OF AN OPTICAL DEVICE DISPOSED IN A VACUUM CHAMBER

The invention relates to a method of cleaning at least one surface of an optical device disposed in a vacuum chamber, which is at least partially contaminated by atoms and/or ions of metalloid and/or metal introduced by a radiation source generating, in particular, extreme ultraviolet radiation and/or soft X-rays.

The extreme ultraviolet radiation and/or soft X-rays generated by the radiation sources are conducted by a reflecting surface of an optical device onto a workpiece to be machined. Such methods are to be used in future to irradiate wafers in a lithographic process. The optical device, which may be, for example, a monochromator, a collector mirror or a multi-layer mirror, hereby reacts sensitively in terms of reflecting power to contamination of any kind.

The contamination, also known as debris, arises mainly from the radiation sources normally used nowadays. So, for example, a plasma into which a working gas has been introduced is generated by electrical discharge. The working gas preferably comprises a material vapor with at least one element, which emits radiation in the range of approximately 13.5 nm. Alternatively, the radiation may be generated by a laser-induced pulsed-plasma method, in which material is used in the form of targets. In addition to the noble gas xenon, metals such as lithium, tin and antimony and/or metalloids such as tellurium, germanium and gallium are increasingly being used nowadays.

The latter materials, on arriving from the radiation source, can be deposited on the optical devices located within the vacuum chamber. A spatial separation of the radiation source and the optical device is not possible since virtually any material, including windows or lenses, absorbs the radiation.

The surface of an optical device is extremely smooth—it exhibits a very low roughness—and comprises e.g. a metallic surface, which contains e.g. molybdenum, ruthenium and/or silicon. Such surfaces, which reflect, in particular, UV-E rays, show a pronounced reduction in reflecting power if the material coming from e.g. the radiation source is precipitated onto them. For example, an approximately 10% reduction in reflecting power arises from a monoatomic deposition of tin atoms on a ruthenium surface.

Different methods and appliances are known for the reduction of deposition arising from the radiation source. For example, so-called foil traps and electrostatic systems reduce the deposition per unit of time by approximately a factor of 1000. This leads to a service life of the optical device of the order of around a few minutes to around a few hours. These service life times are unacceptable, in particular for the intended mass production of wafers.

It is therefore an object of the invention to specify a method and an appliance with the features specified above that increase the service life of the optical device using technically simple means.

This object is achieved in accordance with the invention for a method of the above-mentioned kind in that a temperature prevailing on the surface and/or a pressure in the vacuum chamber is adjusted in such a way that the atoms and/or ions hitting the surface can move upon it.

As a result of the movement of the atoms and/or ions, they migrate into, for example, areas on the surface of the optical device that are located outside of a solid angle used for a projection. Since a large number of the atoms and/or ions are already retained by the use of e.g. foil traps, they migrate, in particular from a useful area on the surface of the optical device provided for reflection purposes, into adjacent boundary areas, since, at the start, any concentration of atoms and/or ions is low here. The movement is determined by the concentration gradient. This general phenomenon, designated diffusion, leads to a relative depletion or reduction of deposition in the sphere of the useful area required for the reflection. On the surface, i.e. the boundary area between the optical device and vacuum chamber, this physical balancing process, in the course of which, owing to their thermal agitation, the atoms and/or ions migrate from areas with higher to others with lower concentrations, leads to contamination being carried away from the useful area.

The useful area of the optical device of course heats up rapidly owing to the absorption phenomenon of the radiation hitting the surface. Especially in the case of high-powered radiation sources with an output power in the range from around 100 to 150 W, temperatures of several hundred degrees C. are reached on the surface of the optical device, so an efficient removal of the atoms and/or ions can be ensured.

The method preferably takes a form such that the temperature of the surface is set in the range from around 200° C. to around 600° C. By specific setting of this temperature interval on the surface of the optical device, in particular the mobility of the atoms and/or ions can be optimized. It must, of course, hereby be ensured that the temperature is always below the melting point of the optical device or of its surface. In addition, the temperature should be adjusted in such a way that a diffusion of the atoms and/or ions into the surface of the optical device does not occur. This is especially easy to achieve, in particular in the case of high-melting reflective materials such as rhodium, molybdenum or ruthenium on the one hand, and relatively low-melting compounds, containing e.g. tin or lithium, which convert the plasma energy efficiently into radiation, on the other. However, the temperature is, of course, selected to be hot enough for the highest possible thermally-induced relative movement of the atoms and/or ions to be achieved on the surface of the optical device, in order to ensure a rapid removal of the deposits from the useful area.

Owing to their differing distances from the radiation source or to a varying useful area, individual components of the optical device may, of course, become too hot or not hot enough during operation. The method is therefore designed in such a way that at least the surface of the optical device is heated or cooled.

As a result, the evaporation of the atoms and/or ions from the surface can also be deliberately prevented.

It is of particular advantage for the method if the atoms and/or ions that can move on the surface are halted and collected at at least one obstacle whose positioning can be predetermined. By positioning the obstacle on the surface of the optical device outside of the useful area, a directional diffusion of the deposits is achieved. The obstacle hereby acts as an aggregation center. Although, as a result of the aggregation center, the concentration of atoms and/or ions rises in the boundary area of the optical device and counteracts the concentration gradient, this is strongly overridden by the surface tension effect.

An advantageous further embodiment of the method provides that the obstacle is an elevation or recess. If it exhibits, in particular, a sufficient height, the version with the elevation, as a type of barrier, leads to an improved accumulation of the atoms and/or ions. The recesses act analogously as a type of aggregation center, supporting and controlling the formation of islands or clusters of the striking material outside of the useful area.

One especially advantageous embodiment of this method provides that the elevation takes, for example, a strip-like, cylindrical or peg-like shape. Any shape of the elevation with adequate spatial dimensions is, of course, possible hereby. Since the elevations may have dimensions in the range of a few atomic radii, the shapes specified here as especially advantageous should be viewed as a rough description. With a strip-like shape of the elevation, a barrier to collect relatively large amounts of atoms and/or ions, extending in the longitudinal direction of the surface of the optical device, can be advantageously obtained, as a result of which the service life of the optical device is extended. Depending on the material of the substance contaminating the surface of the optical device, the aggregation can be facilitated by a suitable geometric shape of the elevation.

The method may advantageously be further developed in such a way that the elevation is arranged so as to run along the surface so that it is parallel with the rays, either to some extent or completely. As a result, shading effects in particular, which could occur as a result of a blocking of the rays hitting against the elevation and lead to a lower reflexivity of the optical device or a lower useful area of the optical device, can be virtually completely avoided.

One further advantage of the method consists in the elevation being produced from, for example, copper, nickel or a different material promoting the formation of accumulations. As a result of the materials selected for the elevation on the basis of the deposits, the aggregation can be strongly promoted by, in particular, a chemical affinity between the deposits and the selected materials.

A further improvement of the method can be achieved by applying the elevation to the surface of the optical device by, for example, a CVD process. The elevation may, of course, be applied to the surface of the optical device by means of any process known among experts. The Chemical Vapor Deposition (CVD) process hereby represents an especially cost-effective, simple method of placing the elevations preferably in the boundary area of the optical device, i.e. in an area against which e.g. as low as possible a radiation intensity impinges.

In one further embodiment of the method, the recess takes the form of a slot or groove or is executed as a hole. The recess too may, of course, assume any conceivable shape. However, it should be of spatial dimensions large enough that a sufficiently large quantity of deposits can be accumulated to allow the aggregation of further material. Particular mention is again made here of shapes such that they extend in a longitudinal direction along the surface of the optical device in order that, in particular, relatively large quantities can be bound. Atoms and/or ions contaminating the surface can, of course, also be absorbed by a hole.

The method may be improved to the effect that the recess is produced by, for example, a photochemical process or by laser treatment. The recess can be produced on the surface of the optical device especially easily by the photochemical process, e.g. by a lithographic method in conjunction with a chemical one, or by any other process suitable for the task, such as laser erosion.

The method may additionally be designed in such a way that a distance of roughly a few micrometers up to roughly one millimeter exists between the elevations and/or recesses. The distance between the obstacles, e.g. in the form of elevations and/or recesses, should hereby be of dimensions such that they correspond to or, preferably, fall below a diffusion distance to be determined under the pressure prevailing in the vacuum chamber and the temperature arising on the surface of the optical device.

The method may advantageously be designed in such a way that the atoms and/or ions accumulated at the obstacle are removed from the surface of the optical device, e.g. by a chemical process. A type of recycling of both the obstacles themselves and the materials accumulated at the obstacles is hereby possible. The complicated, and therefore costly, dismantling of the optical device disposed in the vacuum chamber can hereby be dispensed with. To this end, a suitable reaction partner, for example, is introduced into the vacuum chamber, which reaction partner preferably generates, by means of a chemical reaction with the accumulations, a compound with a boiling point that is exceeded under the pressure and temperature conditions prevailing in the vacuum chamber.

Under one especially advantageous embodiment of the method, the surface is provided with a coating. This coating exhibits, for example, a very low affinity with the atoms and/or ions. The coating can, in addition, also protect the surface during cleaning by the above-described chemical reaction.

In order to improve the method further, the coating may be executed with a layer thickness of up to approximately 0.5 nm. The layer thickness is hereby selected such that, for example, the absorption of the rays by the coating is less than roughly 5%.

It is furthermore an object of the invention to specify an appliance for cleaning at least one surface of an optical device disposed in a vacuum chamber, which may be at least partially contaminated by atoms and/or ions of metalloid and/or metal introduced by a radiation source generating, in particular, extreme ultraviolet radiation and/or soft X-rays.

With this appliance, this object is achieved in accordance with the invention in that a temperature prevailing on the surface and/or a pressure in the vacuum chamber can be adjusted by means of control devices, in order that the atoms and/or ions hitting the surface can move upon it.

The pressure in the vacuum chamber, which can be adjusted by a vacuum device, normally lies in the range of approximately 0.1 mbar hereby.

Since the advantages of the further embodiments correspond with those of the method in accordance with the invention, their detailed description will be omitted.

The invention will be further described with reference to examples of embodiments shown in the drawings, to which, however, the invention is not restricted.

Identical reference characters always relate to the same structural features and, unless otherwise specified below, always refer to both Figures.

Figure 1:
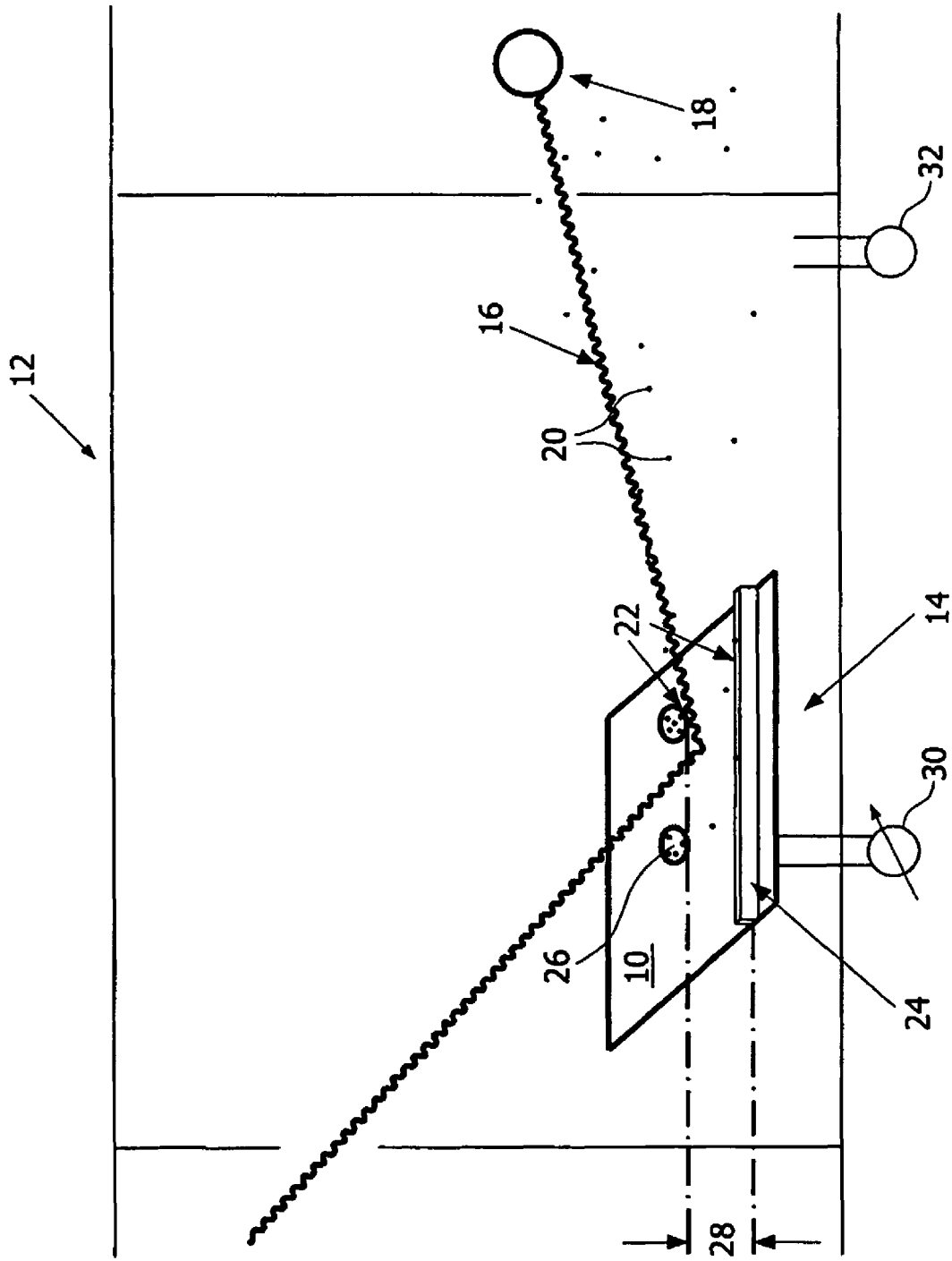
FIG. 1 shows a schematic representation of a vacuum chamber with an optical device, together with the radiation source.

As shown in FIG. 1, a surface 10 of an optical device 14, which operates together with a radiation source 18, generating, in particular, extreme ultraviolet radiation and/or soft X-rays 16, and which is disposed in a vacuum chamber 12, is contaminated during operation. This contamination hereby arises through the impinging of atoms and/or ions 20 resulting from a working gas used in the radiation source 18, e.g. for the generation of radiation 16. The atoms and/or ions 20 hitting the surface 10 can move as a result of the temperature on the surface 10, which is adjustable by means of a control device 30, and/or the pressure in the vacuum chamber 12, which is variable by means of a control device 32. The temperature of the surface 10 is hereby selected in an interval of approximately 200° C. to approximately 600° C. in order to achieve, in particular, a rapid surface diffusion of the atoms and/or ions 20 contaminating the surface 10. By the arrangement of at least one obstacle 22 on the surface 10, the diffusive atoms and/or ions 20 are halted and accumulated. The obstacle 22 may hereby take the form of an elevation 24 or a recess 26.

The elevation 24 shown here is hereby roughly strip-shaped and aligned, roughly or completely, in parallel with the impinging rays 16. This elevation 24 may be applied to the surface 10 by e.g. a CVD process. The elevation 24 is hereby preferably located outside of a useful area required for the reflection of the radiation 16.

The obstacle 22 may, of course, also take the form of at least one hole 26. These holes 26 may be disposed on the surface 10 by e.g. a photochemical process.

Between the obstacles 22, a distance 28 in the range from a few μm to roughly one millimeter may be provided and, preferably, selected such that a diffusion distance of the atoms and/or ions 20, as previously known under the prevailing pressure and temperature conditions in the vacuum chamber 12 and on the surface 10 respectively, is achieved or, preferably, undershot.

Figure 2:
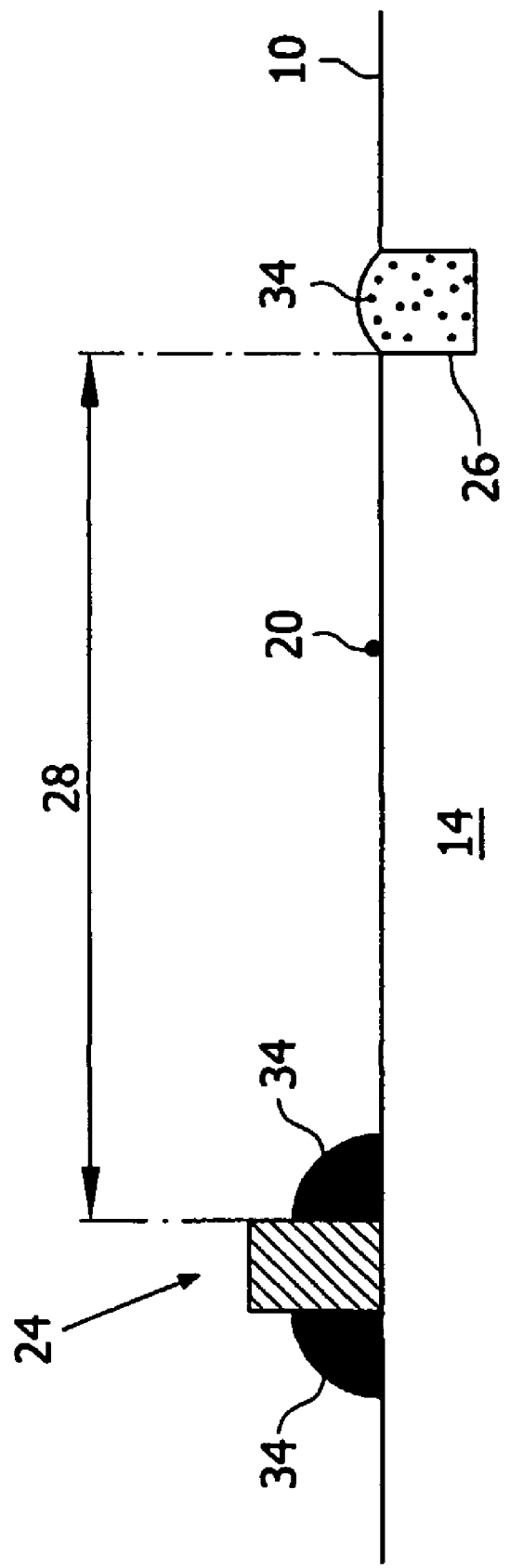
FIG. 2 shows the schematic cross-section of the optical device as shown in FIG. 1.

FIG. 2 shows a schematic cross-section of an optical device 14 with an, in particular, reflective, heatable surface 10. At least one atom and/or ion 20 contaminating the surface 10 can diffuse over the surface under the adjustable temperature and/or pressure conditions. The elevation 24 and recess 26, separated at a distance 28 from one another, absorb the atoms and/or ions 20 and remove them from the surface 10. At least one accumulation 34 forms hereby, whereby, for example, a suitable choice of a material for the elevation 24, e.g. copper or nickel, promotes the formation of accumulations 34 as a result of chemical affinity between the elevation material and the atoms and/or ions 20. Alternatively, a surface tension, for example, could promote the formation of accumulations. Finally, the accumulation 34 in the form of droplets can be removed from the surface 10 of the optical device 14 by, for example, a chemical process. To this end, a suitable reaction partner, which reacts with the accumulations 34 to form an e.g. volatile reaction product, may be removed via a pump system connected to the vacuum chamber 12 shown in FIG. 1 without having to undergo the time-consuming dismantling of the optical device 14.

A thermal method of removing the accumulations may, of course, also be applied, providing there is a sufficiently great difference between the melting point of the optical device 14 and the boiling point of the accumulations 34.

The surface 10 shown in FIGS. 1 and 2 may also be equipped with a coating. If, for example, the surface 10 contains ruthenium, a coating of, for example, up to approximately 0.5 nm ruthenium dioxide may be produced by a chemical method.

In accordance with the invention, a method and an appliance are specified for cleaning the surface of at least one optical device, increasing the service life of the optical device during the operation of a radiation source generating, in particular, extreme ultraviolet radiation and/or soft X-rays.

LIST OF REFERENCE CHARACTERS

10 Surface
12 Vacuum chamber
14 Optical device
16 X-rays
18 Radiation source
20 Atom and/or ion
22 Obstacle
24 Elevation
26 Recess
28 Distance
30 Control device I
32 Control device II
34 Accumulation

The invention claimed is:

1. A method of cleaning a first portion of at least one surface of an optical device disposed in a vacuum chamber, which device is at least partially contaminated by contaminants introduced by a radiation source, the method comprising the acts of:
    adjusting at least one of a temperature prevailing on the at least one surface and a pressure in the vacuum chamber such that the contaminants hitting the at least one surface are removed from the first portion of said at least one surface;
    providing at least one obstacle located at a second portion of said at least one surface, the second portion being outside the first portion to be cleaned; and
    collecting the contaminants at said at least one obstacle, wherein said at least one obstacle includes at least one recess formed in said at least one surface and the at least one recess includes at least one of a slot and a groove.

2. The method as claimed in claim 1, wherein the temperature of the at least one surface is set in a range from around 200° C. to around 600° C.

3. The method as claimed in claim 1, further comprising the act of at least one of heating and cooling the at least one surface of the optical device.

4. The method as claimed in claim 1, wherein the obstacle further includes at least one elevation.

5. The method as claimed in claim 4, wherein a shape of the elevation has at least one of a strip-like, a cylindrical and a peg-like shape.

6. The method as claimed in claim 4, wherein the elevation is arranged so as to run approximately or fully parallel with rays emitted from the radiation source along the at least one surface.

7. The method as claimed in claim 4, wherein the elevation includes at least one of copper, nickel and further material configured to promote formation of accumulations of the contaminants.

8. The method as claimed in claim 4, wherein the elevation is applied to the at least one surface of the optical device by a CVD process.

9. The method as claimed in claim 1, wherein the recess is produced by at least one of a photochemical process and a laser treatment.

10. The method as claimed in claim 4, wherein a distance in a range from a few μm to roughly one millimeter exists between the elevation and the recess.

11. The method as claimed in claim 1, wherein the contaminants are removed from the at least one surface of the optical device by a chemical process.

12. The method as claimed in claim 1, wherein the at least one surface is provided with a coating.

13. The method as claimed in claim 12, wherein the coating is executed with a layer thickness of up to approximately 0.5 nm.

14. The method of claim 1, further comprising the act of removing the contaminants from the at least one obstacle, wherein the collecting act includes the acts of:
    providing a reaction partner;
    forming a product by reaction of the reaction partner with the contaminants; and
    removing the product via a pump system connected to the vacuum chamber, wherein the product is removed without dismantling of the optical device.

* * * * *